(12) United States Patent
Zeeshan et al.

(10) Patent No.: US 12,131,948 B2
(45) Date of Patent: *Oct. 29, 2024

(54) TECHNIQUES FOR VOID-FREE MATERIAL DEPOSITIONS

(71) Applicant: Applied Materials, Inc., Santa Clara, CA (US)

(72) Inventors: M. Arif Zeeshan, Manchester, MA (US); Kelvin Chan, San Ramon, CA (US); Shantanu Kallakuri, Ithaca, NY (US); Sony Varghese, Manchester, MA (US); John Hautala, Beverly, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/224,904

(22) Filed: Jul. 21, 2023

(65) Prior Publication Data

US 2023/0369112 A1    Nov. 16, 2023

Related U.S. Application Data

(63) Continuation of application No. 17/028,259, filed on Sep. 22, 2020, now Pat. No. 11,749,564.

(51) Int. Cl.
*H01L 21/768* (2006.01)
*H01L 21/48* (2006.01)

(52) U.S. Cl.
CPC ...... *H01L 21/76879* (2013.01); *H01L 21/486* (2013.01)

(58) Field of Classification Search
CPC ............ H01L 21/76879; H01L 21/486; H01L 21/76865
See application file for complete search history.

(56) References Cited

U.S. PATENT DOCUMENTS

| 5,747,379 | A | 5/1998 | Huang |
| 7,473,597 | B2 | 1/2009 | Lee |
| 8,034,683 | B2 | 10/2011 | Cho |
| 9,704,973 | B2 | 7/2017 | Xie |

(Continued)

FOREIGN PATENT DOCUMENTS

CN    104272440 A    1/2015

OTHER PUBLICATIONS

T. Schloesser et al., A 6F2 Buried Wordline DRAM Cell for 40nm and Beyond,: Proc IEDM 2008, pp. 809-812.

(Continued)

*Primary Examiner* — Dale E Page
*Assistant Examiner* — Quovaunda Jefferson
(74) *Attorney, Agent, or Firm* — KDW FIRM PLLC

(57) ABSTRACT

Embodiments herein include void-free material depositions on a substrate (e.g., in a void-free trench-filled (VFTF) component) obtained using directional etching to remove predetermined portions of a seed layer covering the substrate. In several embodiments, directional etching followed by selective deposition can enable fill material (e.g., metal) patterning in tight spaces without any voids or seams. Void-free material depositions may be used in a variety of semiconductor devices, such as transistors, dual work function stacks, dynamic random-access memory (DRAM), non-volatile memory, and the like.

16 Claims, 12 Drawing Sheets

(56) References Cited

U.S. PATENT DOCUMENTS

| | | |
|---|---|---|
| 10,109,490 B1 | 10/2018 | Lin |
| 10,109,526 B1 | 10/2018 | Zhang |
| 11,749,564 B2 * | 9/2023 | Zeeshan ............ H01L 21/76879 |
| | | 438/667 |
| 2009/0065817 A1 | 3/2009 | Cartier |
| 2013/0214234 A1 | 8/2013 | Gopalan |
| 2014/0367795 A1 | 12/2014 | Cai |
| 2015/0050807 A1 | 2/2015 | Wu |
| 2015/0083581 A1 | 3/2015 | Sherman |
| 2016/0071764 A9 | 3/2016 | Chandrashekar |
| 2018/0130707 A1 | 5/2018 | Clendenning |
| 2018/0182623 A1 | 6/2018 | Lee |
| 2020/0098623 A1 | 3/2020 | Cheng |
| 2020/0135578 A1 | 4/2020 | Ching |

OTHER PUBLICATIONS

Tae-Su Jang et al., "Study on the Vt variation and bias temperature instability characteristics of TiN/W and TiN metal buried-gate transistor in DRAM application," 2014 IEEE International Physics Symposium (Jul. 21, 2014), 4 pages.

Talukdar et al., "Seamless fill of deep trenches by chemical vapor deposition: Use of a molecular growth inhibitor to eliminate pinch-off," JVST, 2019, 11 pages.

\* cited by examiner

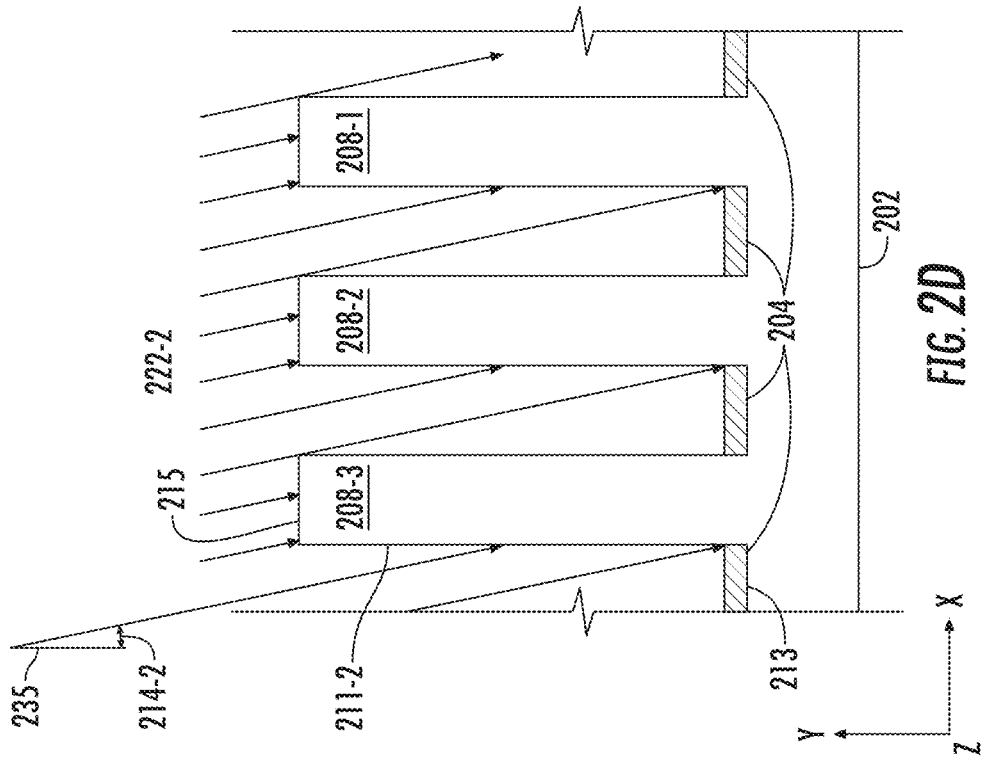
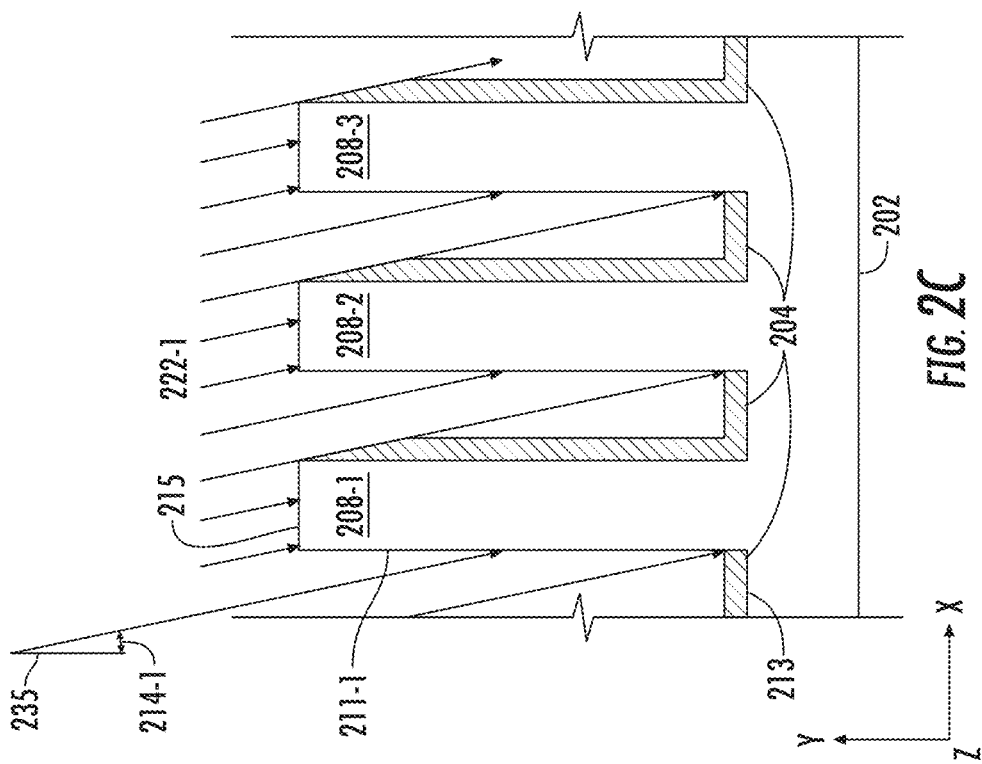

TECHNIQUES FOR VOID-FREE MATERIAL DEPOSITIONS

CROSS-REFERENCE TO RELATED APPLICATION

This application is a continuation application and claims priority of U.S. Non-Provisional application Ser. No. 17/028,259, filed Sep. 22, 2020, entitled "TECHNIQUES FOR VOID-FREE MATERIAL DEPOSITIONS," the entire contents of which applications incorporated by reference herein.

FIELD OF THE DISCLOSURE

The present disclosure generally relates to void-free material depositions (VFMDs). More specifically, the disclosure relates to utilizing directional etching to obtain VFMDs.

BACKGROUND OF THE DISCLOSURE

A semiconductor device is an electronic component that relies on the electronic properties of a semiconductor material to function, such as by controlling the conductivity of the semiconductor with the introduction of an electric or magnetic field. A transistor is the most common type semiconductor device. A transistor is used to amplify or switch electronic signals and electrical power. Typically, a transistor is composed of semiconductor material with at least three terminals for connection to an external circuit. The most common type of transistor is a metal-oxide-semiconductor field-effect transistor (MOSFET). A MOSFET has a gate terminal, a source terminal, and a drain terminal. The gate is charged to produce an electric field that controls the conductivity of a "channel" between the source and the drain. Depending on the type of carrier in the channel, the device may be an n-channel (for electrons) or a p-channel (for holes) MOSFET.

Semiconductor devices are manufactured as single discrete devices and as integrated circuits, which include two or more devices, and which can number from the hundreds to the billions-manufactured and interconnected on a single substrate (e.g., a semiconductor wafer). Semiconductor devices are manufactured with exacting standards and precision techniques such as VFMDs. One of the techniques for VFMDs include forming trenches in a substrate that are later filled with another material, such as metal, during the manufacture of semiconductor devices.

Oftentimes, the trenches are filled using a chemical vapor deposition (CVD) process. Despite meticulous control over deposition conditions in early-node and current-node devices, traditional CVD approaches suffer from seams and voids due to overhang pinch-off and "bread-load" effects. Filling trenches with a material while preventing voids from forming has traditionally been a time-consuming and complex process, which adds considerable costs to devices fabricated using the process. For example, forming void-free trench fills has traditionally required surface treatments that complicate process flows and/or require pre-existing metal at the bottom of the trench.

Accordingly, improved methods and related equipment are needed for void-free material depositions, such as for the manufacture of semiconductor devices.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one aspect, the present disclosure relates to method including, one or more of providing a device layer including a first sidewall opposite a second sidewall, and a trench surface extending between the first and second sidewalls. The method may further include providing a seed layer over the device layer, removing the seed layer from the first sidewall and the second sidewall using an angled ion etch oriented at a non-zero angle of inclination relative to a perpendicular extending from the trench surface, wherein the seed layer remains along the trench surface following the angled ion etch, and forming a fill material over the device layer.

In some embodiments, the angled ion etch comprises simultaneously removing the seed layer from the first sidewall and the second sidewall. In various embodiments, the angled ion etch comprises one or more of removing the seed layer from the first sidewall; rotating the device layer; and removing the seed layer from the second sidewall after the device layer is rotated. In many embodiments, the fill material is formed by chemical vapor deposition or by atomic layer deposition. In several embodiments, removing the seed layer comprises removing the seed layer from just an upper portion of the first and second sidewalls. In some embodiments, the fill material is formed along just a lower portion of the first and second sidewalls. In various embodiments, the method may include one or more of removing the seed layer along an entire height of the first and second sidewalls and forming the fill material along the entire height of the first and second sidewalls. In many embodiments, providing the device layer comprises providing a plurality of fins extending from a substrate, and wherein each of the plurality of fins includes the first sidewall opposite the second sidewall.

In another aspect, the present disclosure relates to a method of forming a memory device including one or more of providing a device layer including a first sidewall opposite a second sidewall, and a trench surface extending between the first and second sidewalls, and providing a seed layer over the device layer including along the first sidewall, the second sidewall, and the trench surface. The method may further include removing the seed layer from the first sidewall and the second sidewall using an angled ion etch oriented at a non-zero angle of inclination relative to a perpendicular extending from the trench surface, wherein the seed layer remains along the trench surface following the angled ion etch, and forming a metal fill material over the device layer.

In some embodiments, the angled ion etch comprises simultaneously removing the seed layer from the first sidewall and the second sidewall. In various embodiments, the metal fill material is formed by chemical vapor deposition or by atomic layer deposition. In many embodiments, removing the seed layer comprises removing the seed layer from just an upper portion of the first and second sidewalls. In several embodiments, the metal fill material is formed along just a lower portion of the first and second sidewalls. In some embodiments, the method of forming a memory device may include one or more of removing the seed layer along an entire height of the first and second sidewalls and forming the metal fill material along the entire height of the first and second sidewalls.

In yet another aspect, the present disclosure relates to a method of forming a semiconductor device including one or more of providing a plurality of device structures extending from a base layer, each of the plurality of device structures a first sidewall opposite a second sidewall, and a trench surface extending between the first and second sidewalls. The method may further include providing a seed layer over each of the plurality of device structures including along the first and second sidewalls and along the trench surface, removing the seed layer from the first sidewall and the second sidewall of each of the plurality of device structures using an angled ion etch oriented at a non-zero angle of inclination relative to a perpendicular extending from the trench surface of the base layer, wherein the seed layer remains along the trench surface of the base layer, and depositing a metal fill material between each of the plurality of device structures.

In some embodiments, the angled ion etch comprises simultaneously removing the seed layer from the first sidewall and the second sidewall of each of the plurality of device structures. In various embodiments, the angled ion etch comprises one or more of removing the seed layer from the first sidewall of each of the plurality of device structures; rotating the plurality of device structures and the base layer; and removing the seed layer from the second sidewall of each of the plurality of device structures. In many embodiments, the metal fill material is formed by chemical vapor deposition or by atomic layer deposition. In several embodiments, removing the seed layer comprises removing the seed layer from just an upper portion of the first and second sidewalls of each of the plurality of device structures, wherein the seed layer remains along a lower portion of the first and second sidewalls of each of the plurality of device structures following the angled ion etch. In some embodiments, the metal fill material is not formed along the upper portion of the first and second sidewalls of each of the plurality of device structures.

BRIEF DESCRIPTION OF THE DRAWINGS

The accompanying drawings illustrate exemplary approaches of the disclosure, including the practical application of the principles thereof, as follows:

FIGS. 2A-2E illustrate a first exemplary process flow for producing a trench-filled (VFTF) component, according to embodiments of the present disclosure.

Figure 1:
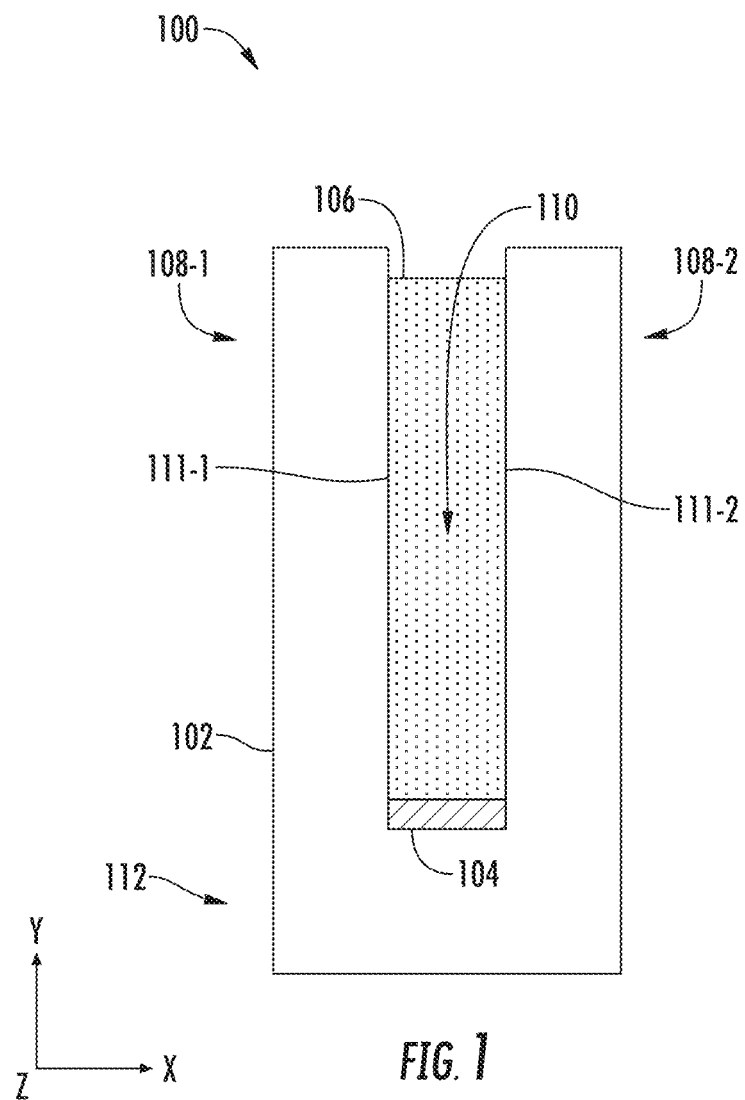
FIG. 1 illustrates a side, cross-sectional view of an exemplary void-free material deposition (VFMD) component, according to embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements. Unless otherwise noted, reference to height, top, bottom, above, under, etcetera refers to a distance, displacement, or position along the y-axis, reference to width, left, right, beside, etcetera refers to a distance, displacement, or position along the x-axis, and reference to depth, in front, behind, etcetera refers to a distance, displacement, or position along the z-axis.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Apparatuses, systems, and methods in accordance with the present disclosure will now be described more fully hereinafter with reference to the accompanying drawings, where various embodiments are shown. The apparatuses, systems, methods may be embodied in many different forms and are not to be construed as being limited to the embodiments set forth herein. Instead, these embodiments are provided so the disclosure will be thorough and complete, and will fully convey the scope of the apparatuses, systems, and methods to those skilled in the art.

Embodiments described herein include a void-free material deposition (VFMD) process including directional etching to remove predetermined portions of a seed layer (e.g., covering the substrate). In many embodiments, the directional etching is followed by depositing a fill material on the substrate, such as via atomic layer deposition (ALD) or chemical vapor deposition (CVD). In some embodiments, the directional etching may remove portions of the seed layer prior to deposition of a bulk selective metal onto the remaining portions of the seed layer. In various such examples, the remaining portions of the seed layer may cover bottom portions of trenches between dielectric fins on the substrate, resulting in a deposition process with a bottom-up void-free metal trench-fill.

In several embodiments, directional etching followed by selective deposition can advantageously enable fill material (e.g., metal) patterning in tight spaces without any voids or seams. In several such embodiments, fill material patterning in tight spaces without any voids or seams (e.g., void-free trench-fills) results in device structures with one or more of higher fill material volumes, higher conductivities, less damage from and/or processing with chemical-mechanical polishing (CMP), and contact/plug uniformity without additional lithography and etching procedures. Oftentimes the device structures may be used in a variety of semiconductor devices and/or memory devices, such as transistors, dual work function stacks, dynamic random-access memory (DRAM), non-volatile memory, metal gap-fill in transistors, logic and memory contact fill, vertically integrated memory gate wordline fill, and the like.

FIG. 1 illustrates a semiconductor component (hereinafter "component") 100 according to one or more embodiments described herein. Component 100 may include a device layer or substrate 102 having a trench surface or base 112 with device structures, i.e., fins 108-1, 108-2, extending vertically along the y-axis from the base 112 (i.e., base layer). Further, the fins 108-1, 108-2 may define trench 110 with first and second sidewalls 111-1, 111-2. Although embodiments hereinafter will be described in the context of a finned substrate, in other embodiments, the trench 110 and the first and second sidewalls 111-1, 111-2 may define one or more contacts or via holes.

In the illustrated embodiments, the bottom of the trench 110 is covered with seed layer 104 and a portion of the trench 110 filled with a fill material 106. In one or more embodiments, component 100 may be referred to as a void-free trench fill (VFTF) component. In one or more such embodiments, fill material 106 may be a bottom-up void-free metal trench-fill. In component 100, seed layer 104 is removed from portions of sidewalls 111-1, 111-2 via directional etching, as will be described in greater detail herein. In many embodiments, one or more components illustrated in FIG. 1, or described with respect thereto, may be the same or similar in construction, function, and/or appearance as one or more other components described herein. Embodiments are not limited in this context.

In the illustrated embodiment, substrate 102 may include a semiconductor material, such as a silicon (Si) semiconductor wafer. In some embodiments, the fins 108 and the base 112 may comprise the same material, such as a semiconductor material. In other embodiments, the fins 108 and the base 112 may comprise different materials (see e.g., FIGS. 6A-6B). For example, the base 112 may comprise a silicon and the fins 108 may comprise a dielectric. In many embodiments, the seed layer 104 may comprise a dielectric material, such as silicon dioxide ($SiO_2$). In several embodiments, the seed layer 104 may be a thin film. In many embodiments, the seed layer 104 may be applied to the fins 108 and base 112 via a CVD or ALD processes.

Trench 110 may be defined by the area/space between sidewalls 111-1, 111-2 and base 112. Trench 110 is filled with fill material 106. In various embodiments, fill material 106 may be formed within the trench 110 without any voids, gaps, seams, etc. In various such embodiments, the fill material 106 may comprise a bottom-up fill, which grows or builds up from the seed layer 104 at the bottom of the trench 110. In other words, the fill material 106 advantageously grows seamlessly up from the seed layer 104 during the deposition process. Oftentimes fill material 106 may comprise a conductor material, such as metal or a metal alloy. In many embodiments, the fill material 106 is deposited over the component 100 including into the trench 110 via a chemical vapor deposition (CVD) or an atomic layer deposition (ALD) process, resulting in bulk ALD or CVD growth.

Figure 2A:
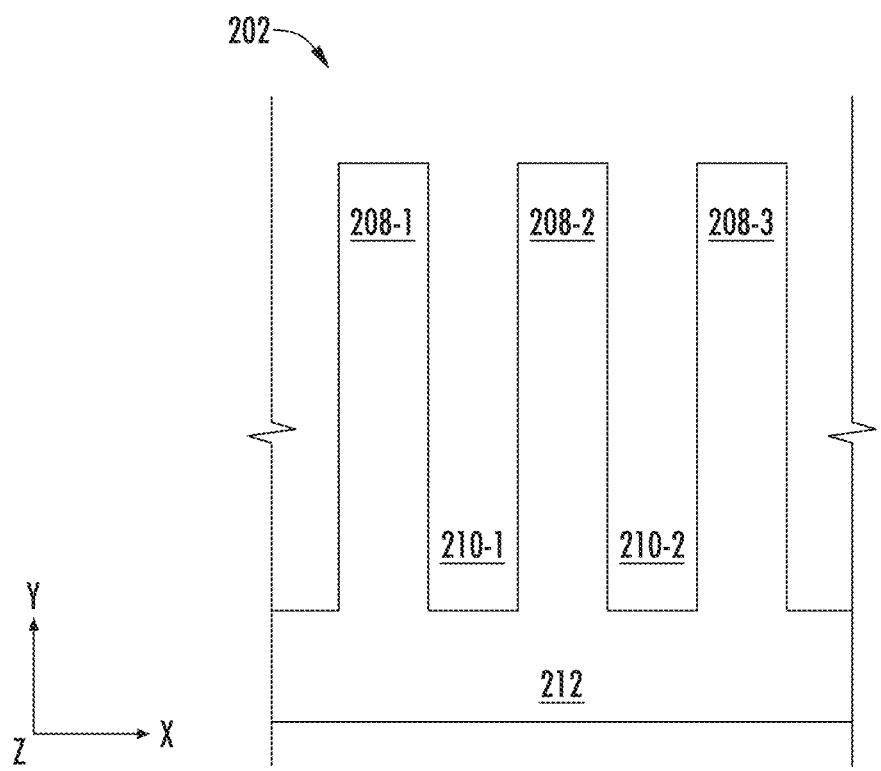
Figure 2B:
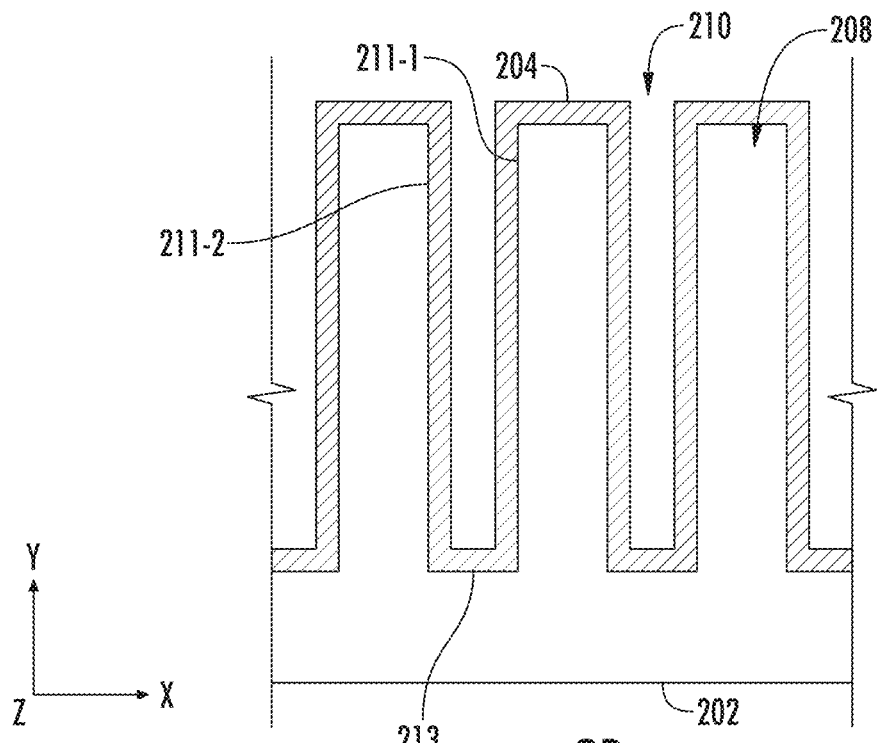

FIGS. 2A-2E illustrate a first exemplary process flow for producing components according to one or more embodiments described herein. FIG. 2A includes a device layer or substrate 202 with fins 208-1, 208-2, 208-3 (or fins (208)), trenches 210-1, 210-2 (or trenches 210), and a base 212. FIG. 2B includes the substrate 202 in conjunction with a seed layer 204 covering the fins 208 and trenches 210. As shown, the seed layer 204 is formed over all exposed surfaces of the component, including over sidewalls 211-1, 211-2 of fins 208 and over a trench surface 213 extending between the fins 208. Generally, the material of seed layer 204 may be a metal (e.g., tungsten), an insulator, or a semiconductor according to different embodiments of the disclosure.

In some embodiments, the seed layer 204 may be formed by a reactive beam generated by any suitable ion source, such as a plasma enhanced chemical vapor deposition (PECVD) source. The reactive beam may be generated of species that condense on a wide variety of substrates having different surface compositions, such as oxides, nitrides, silicon, metal, and so forth, with little or no chemical selectivity. As such, species of the reactive beam may condense on a surface of the substrate 202 generally at or near the point of the substrate that is impacted by the species.

In various non-limiting embodiments, the seed layer 204 may be deposited to a thickness between 1 nm and 10 nm, and in particular embodiments at a thickness of between 2 nm and 4 nm. For tight CD features (FIGS. 4A-4D), where the pitch may be on the order of 20 nm-30 nm or less, and a 10 nm thick seed will fill the whole gap between adjacent surface features, the thickness of the seed layer 204 may be substantially less than the gap between adjacent features. For example, a 30 nm pitch with 15 nm gap and a seed layer thickness of 2 nm-4 nm may be appropriate, while for a 60 nm pitch with 30 nm gap, a seed layer thickness of 5 nm to 8 nm may be possible.

FIG. 2C illustrates a first directional etch 222-1 delivered at a non-zero angle of inclination 214-1 relative to a perpendicular 235 to the substrate 202. In some embodiments, the first directional etch 222-1 may be an angled ion etch, which impacts just the first sidewall 211-1 and a top surface 215 of each of the fins 208. However, the first directional etch 222-1 does not substantially impact the seed layer 204 atop the trench surface 213, as the trench surface 213 is generally shadowed by the adjacent fin 208. As shown, the seed layer 204 may be removed from an entire height (e.g., vertical distance between the trench surface 213 and the top surface 215) of the first sidewall 211-1 without removing the seed layer 204 over the trench surface 213 In other embodiments, the angle of inclination 214-1 may be adjusted so the first directional etch 222-1 only impacts a portion (e.g., an upper portion) of the first sidewall 211-1.

FIG. 2D demonstrates a second directional etch 222-2 delivered at non-zero angle of inclination 214-2 relative to the perpendicular 235. In some embodiments, the second directional etch 222-2 may be performed simultaneously with the first directional etch 222-1. In other embodiments, the second directional etch 222-2 may be performed by rotating the component (e.g., 90 or 180 degrees) after the first directional etch 222-1 is performed. The first and second angle of inclinations 214-1, 214-2 may be symmetric (e.g., mirror symmetric) or substantially symmetric. Further, the process may be line-of-sight, wherein one fin may shadow an adjacent fin from the directional etching.

As shown, the second directional etch 222-2 may be an angled ion etch, which impacts just the second sidewall 211-2 and the top surface 215 of each of the fins 208. However, the second directional etch 222-2 does not substantially impact the seed layer 204 atop the trench surface 213. As shown, the seed layer 204 may be removed from an entire height of the second sidewall 211-2 without removing the seed layer 204 over the trench surface 213. In other embodiments, the angle of inclination 214-2 may be adjusted so the second directional etch 222-2 only impacts a portion (e.g., an upper portion) of the second sidewall 211-2.

Figure 2E:
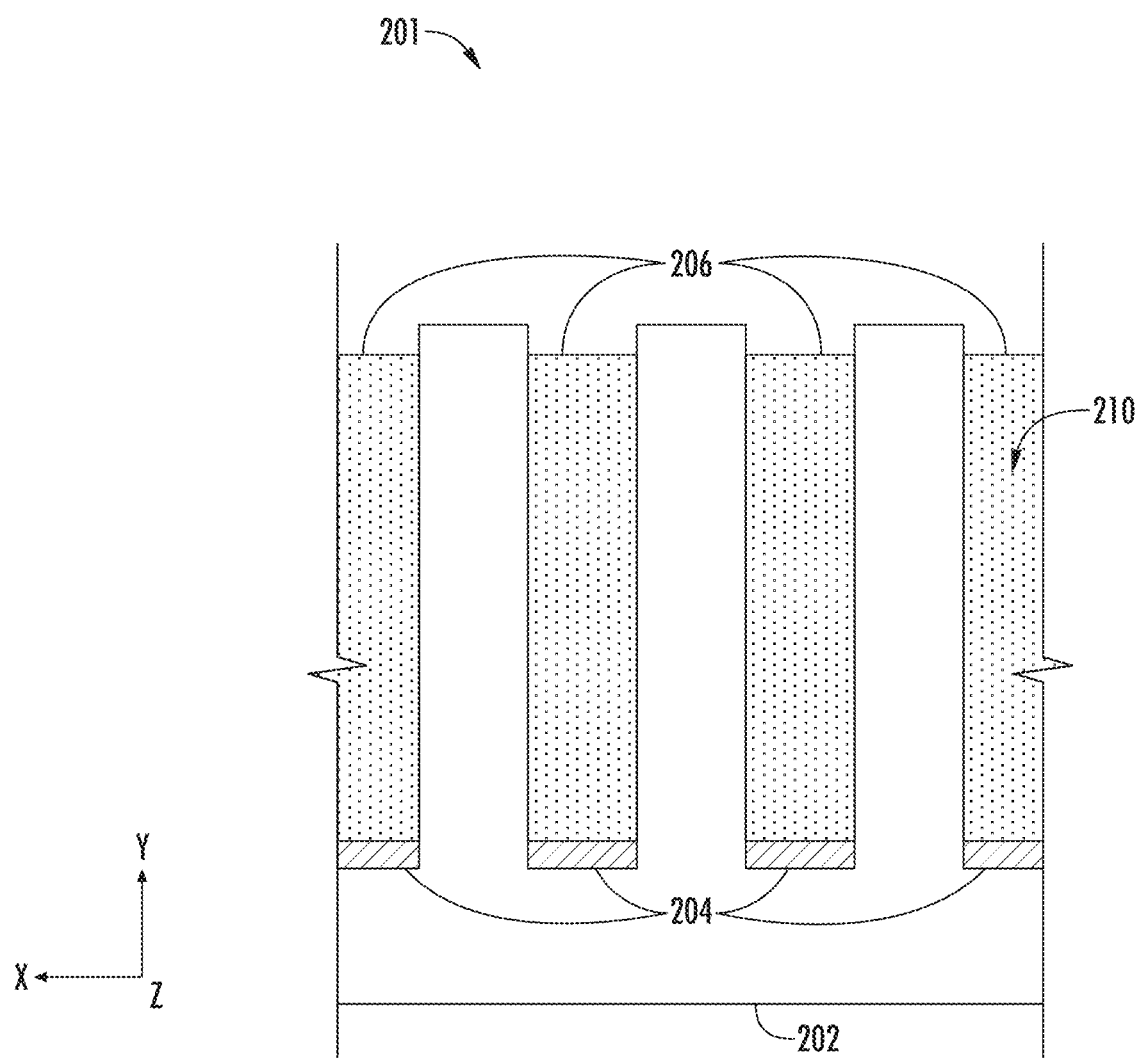

FIG. 2E includes a VFTF component 201 formed by filling a portion of trenches 210 with fill material 206. Fill material 106 may comprise a conductor material, such as metal or a metal alloy. In many embodiments, the fill material 206 is deposited over the VFTF component 201 including over the seed layer 204 via CVD or ALD. In many embodiments, one or more components illustrated in FIGS. 2A-2E, or described with respect thereto, may be the same or similar in construction, function, and/or appearance as one or more other components described herein. Embodiments are not limited in this context.

Figure 3A:
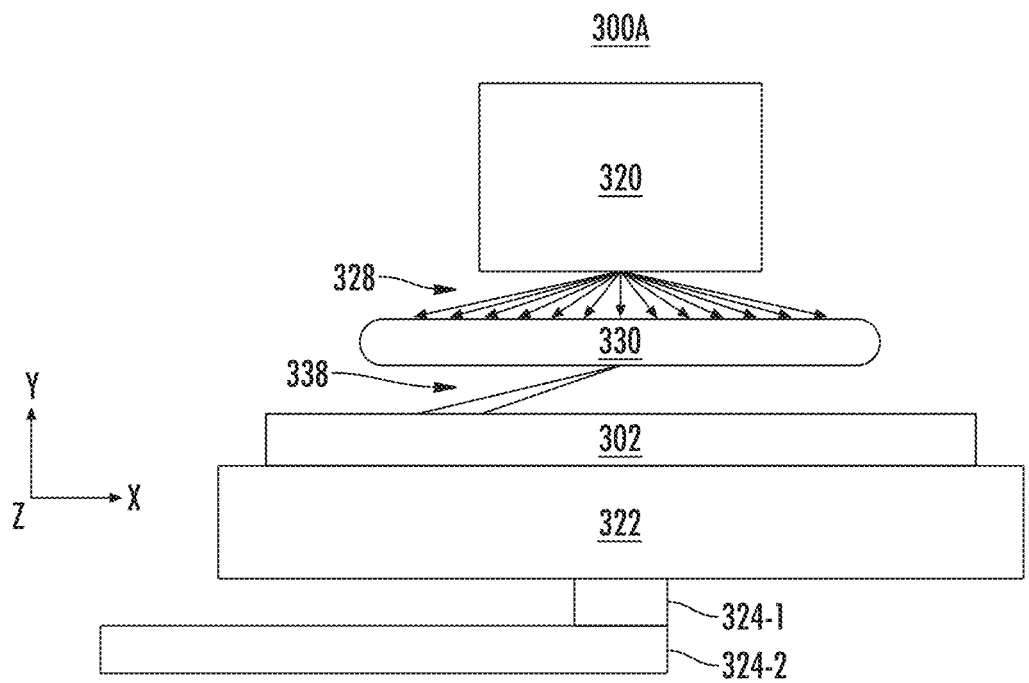
FIGS. 3A and 3B illustrate various aspects of directional etching, according to embodiments of the present disclosure.
Figure 3B:
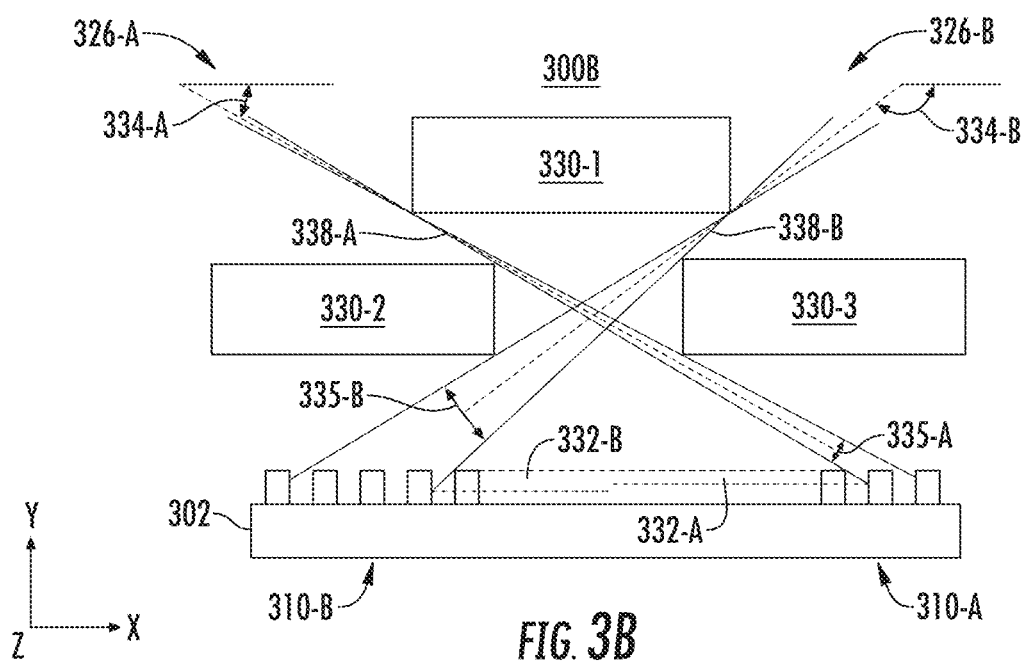

FIGS. 3A and 3B illustrate various aspects of direction etching according to one or more embodiments described herein. FIG. 3A includes a first exemplary operating environment 300A for directional etching and includes a plasma chamber 320, a source beam 328, one or more shadowing elements 330, directional etching beam 338, substrate 302, platen 322, and actuators 324-1, 324-2. FIG. 3B includes a second exemplary operating environment 300B for directional etching and includes first and second orientations 326-A, 326-B (or orientations 326). Orientation 326-A is associated with directional etching beam 338-A, shadowing elements 330-1, 330-2, 330-3, angle 334-A, angle 335-A, trenches 310-A, and depth 332-A. Orientation 326-B is associated with directional etching beam 338-B, shadowing elements 330-1, 330-2, 330-3, angle 334-B, angle 335-B, trenches 310-B, and depth 332-B. In many embodiments, one or more components illustrated in FIGS. 3A and 3B, or described with respect thereto, may be the same or similar in construction, function, and/or appearance as one or more other components described herein. Embodiments are not limited in this context.

The illustrated embodiments demonstrate an exemplary set up, components, and orientations for processing substrate 302, such as via directional etching. Referring to FIG. 3A, source beam 328 may emanate from plasma chamber 320, such as via a plasma source and/or aperture of the plasma chamber 320. The source beam 328 may emanate in a range of directions from the plasma chamber. Shadowing elements 330 may then adjust the source beam 328, such as via shadowing, filtering, reflecting, blocking, and the like, leaving directional etching beam 338. The substrate 302 is exposed to the directional etching beam 338 to perform an etching operation, such as removing a seed layer.

Further, the substrate 302 may rest on platen 322. In some embodiments platen 322 may have an electric charge to facilitate deposition processes (e.g., platen 322 may comprise, or be connected to, an anode or cathode). The platen 322 may be connected to one or more actuators, such as actuators 324-1, 324-2. The actuators may be utilized to position the substrate 302, such as with respect to shadowing elements 330. In several embodiments, the actuators may include robotic arms and/or mechanisms. In the illustrated embodiment, actuator 324-1 may be a rotational actuator and actuator 324-2 may be a linear actuator. In some embodiments, the actuators may scan the substrate 302 past the directional etching beam 338 one or more times in one or more orientations. In one or more embodiments, described herein the orientation of the components in environment 300A may collectively be arranged such that the substrate 302 is exposed to a predetermined directional etching beam 338 to remove selective portions of a seed layer.

In some embodiments, the orientations 326 and/or angles 334 in FIG. 3B may be symmetric and/or mirrored orientations. Oftentimes two directional etching beams may be used simultaneously to eliminate, or reduce, directional etching steps and/or reorienting the substrate 302 between separate directional etching steps. However, in some embodiments, there may be a transition between directional etching in a first orientation and directional etching in a second orientation. For instance, the substrate 302 may be rotated 180 degrees, such as with actuator 324-1, to transition between directional etching in the first orientation and directional etching in the second orientation.

Two exemplary orientations 326-A, 326-B are illustrated in FIG. 3B. Orientation 326-A results in directional etching beam 338-A having a centerline with angle 334-A with respect to the x axis and a beam width angle 335-A. In various embodiments, orientation 326-A may result in a seed layer being removed from trenches 310-A to depth 322-A.

Orientation 326-B results in directional etching beam 338-B having a centerline with angle 334-B with respect to the x axis and a beam width angle 335-B. In various embodiments, orientation 326-B may result in a seed layer being removed from trenches 310-B to depth 322-B. Accordingly, one or more components, aspects, or parameters of a set up may be arranged, or taken into account, to achieve a target orientation, such as one or more of height, angle, distance, overlap, spacing, thickness, pattern, material, position, angle, scanning speed, and the like of and between various components. For example, one or more of the spacing between shadowing elements, the overlap between shadowing elements, the width of trenches, the height of trenches, the height of shadowing elements, the angle of shadowing elements, the angle between shadowing elements, and the like may be utilized to achieve a target orientation. As will be appreciated trigonometry can be used to determine the effects of various length or angle parameters. Although illustrated together, orientations 326 may be separate and not performed simultaneously or with the same components.

Figure 4A:
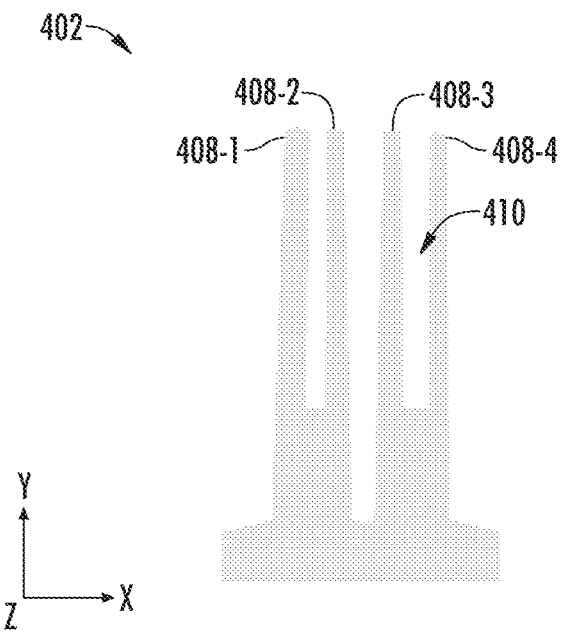
FIGS. 4A-4D illustrate a second exemplary process flow for producing VFTF components, according to embodiments of the present disclosure.
Figure 4B:
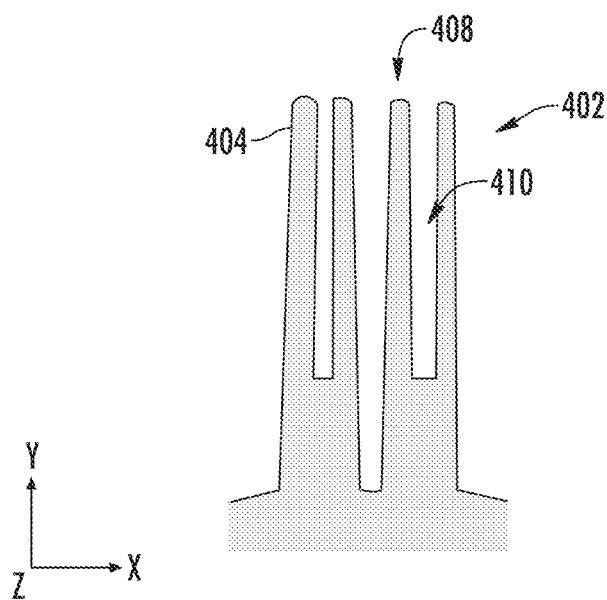
Figure 4C:
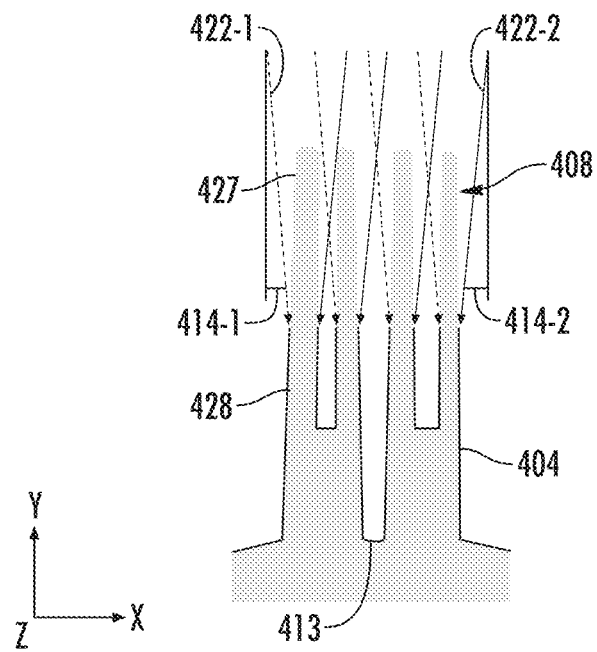

FIGS. 4A-4D illustrate a second exemplary process flow for producing VFTF components according to one or more embodiments described herein. FIG. 4A includes a substrate 402 with fins 408-1, 408-2, 408-3, 408-4 (or fins (408)) and trenches 410 between the fins 408. FIG. 4B includes the substrate 402 in conjunction with a seed layer 404 covering the fins 408 and trenches 410. FIG. 4C demonstrates first and second directional ion etches 422-1, 422-2 delivered at angles 414-1, 414-2, respectively, to remove portions of the seed layer 404. In various embodiments, the angle 414-1 may be 5 degrees and the angle 414-2 may be −5 degrees. As shown, the seed layer 404 may be removed from just an upper portion 427 of one or more of the fins 408. The seed layer 404 may generally remain present along a lower portion 428 of one or more of the fins 408, as well as along a trench surface 413 of the trenches 410. It will be appreciated that adjustment to angles 414-1, 414-2 will influence a depth of seed layer 404 removal from the fins 408.

Figure 4D:
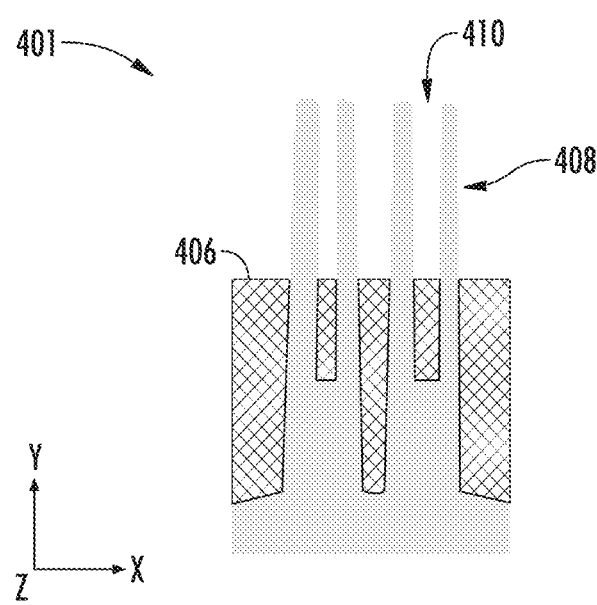

FIG. 4D demonstrates a VFTF component 401 formed by filling a portion of the trenches 410 with a fill material 406. In many embodiments, one or more components illustrated in FIGS. 4A-4D, or described with respect thereto, may be the same or similar in construction, function, and/or appearance as one or more other components described herein. Embodiments are not limited in this context.

Figure 5A:
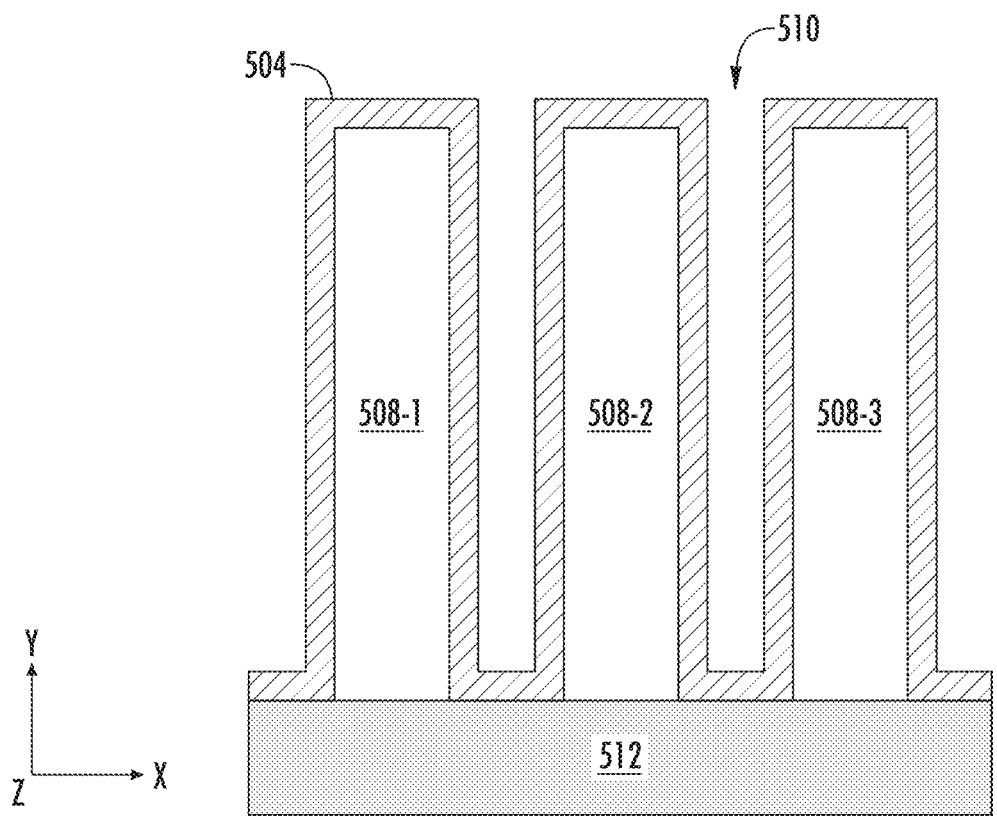
FIGS. 5A-5C illustrate a third exemplary process flow for producing VFTF components, according to embodiments of the present disclosure.
Figure 5B:
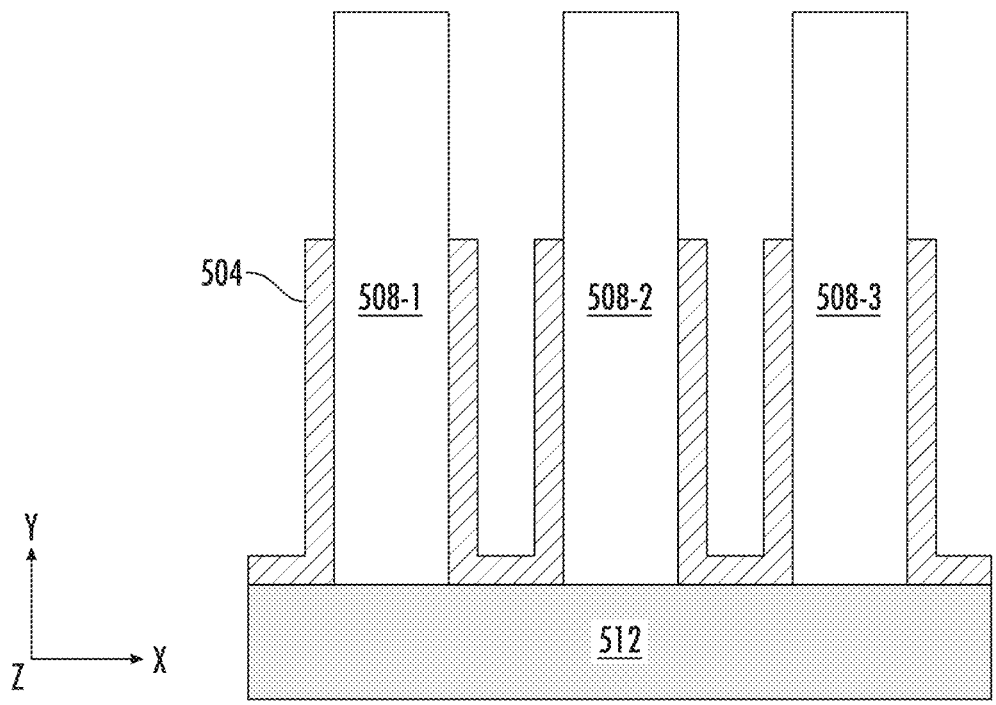
Figure 5C:
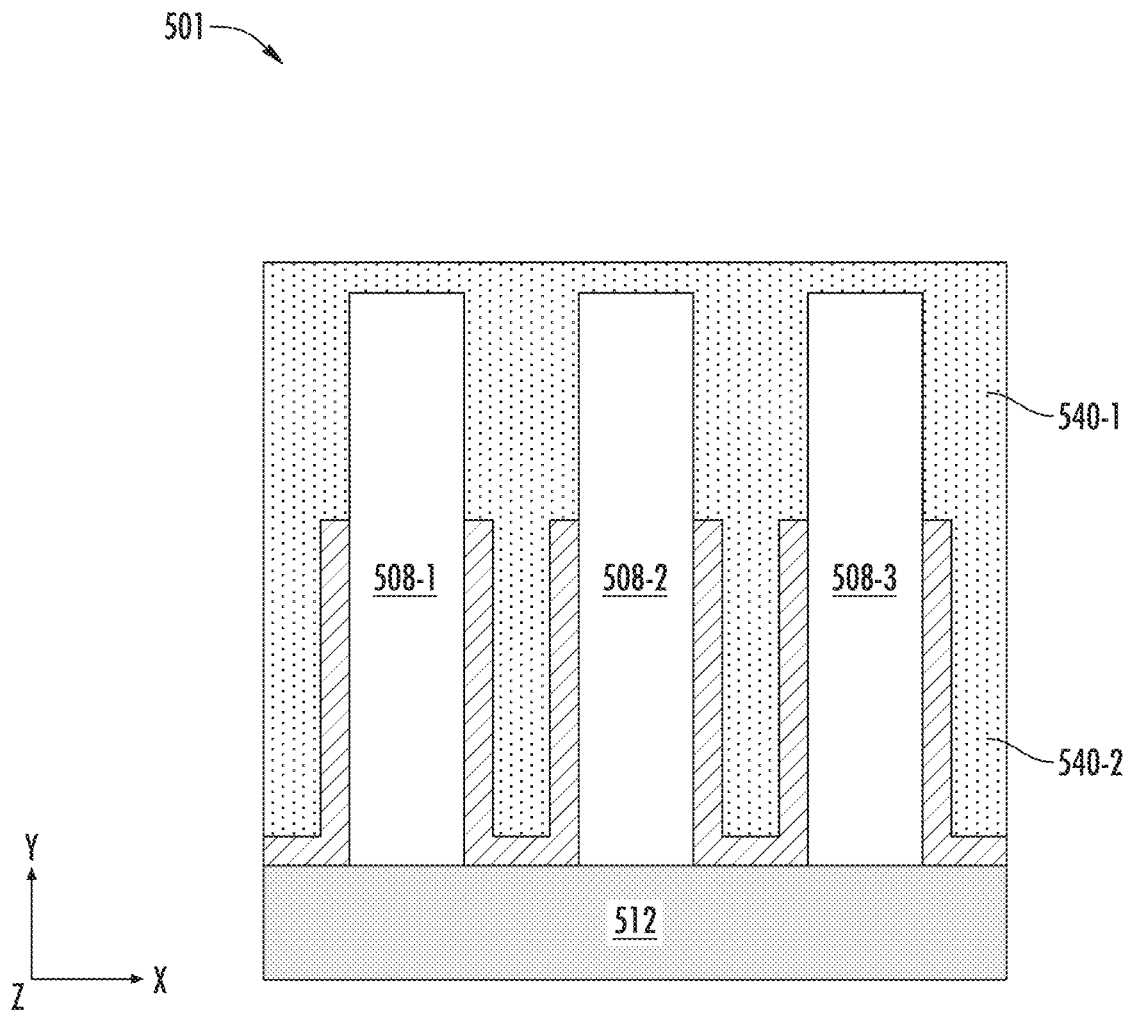

FIGS. 5A-5C illustrate another exemplary process flow for producing VFTF components according to one or more embodiments described herein. FIG. 5A includes a base 512 with fins 508-1, 508-2, 508-3 (or fins 508) extending from base 512 along the y-axis, and trenches 510 between the fins 508. In some embodiments, base 512 may comprise a semiconductor substrate and fins 508 may comprise a dielectric. FIG. 5B includes a portion of fins 508 and base 512 covered in seed layer 504 and a portion of fins 508 uncovered from the seed layer 504 via directional etching. In some embodiments a portion uncovered from the seed layer 504 via directional etching may be referred to as a directionally etched seed layer. FIG. 5C shows a VFTF component 501 including a dual work function stack with work function materials 540-1, 540-2. In many embodiments, one or more components illustrated in FIGS. 5A-5C, or described with respect thereto, may be the same or similar in construction, function, and/or appearance as one or more other components described herein. Embodiments are not limited in this context.

Figure 6A:
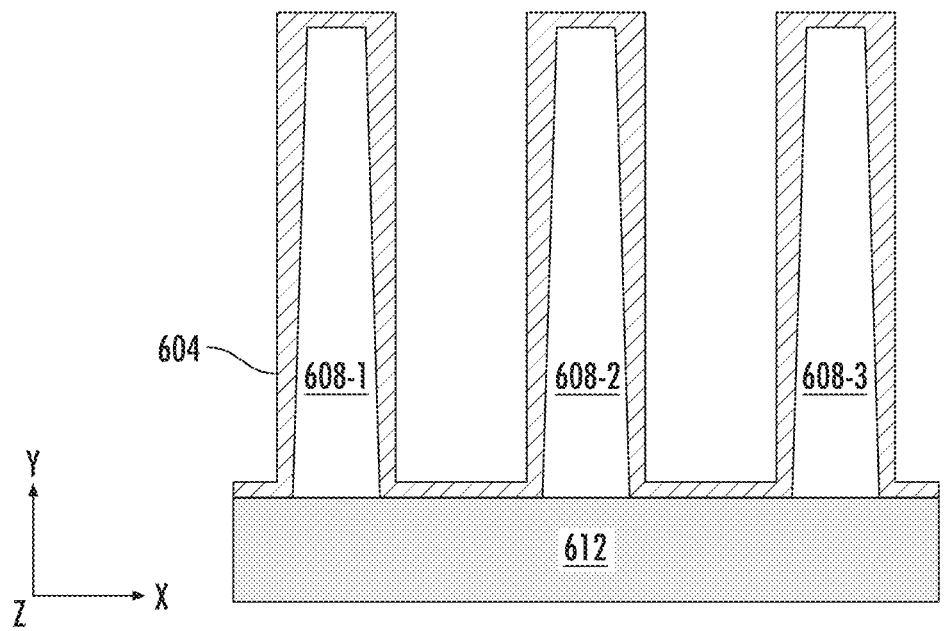
FIGS. 6A-6C illustrate a fourth exemplary process flow for producing VFTF components, according to embodiments of the present disclosure.
Figure 6B:
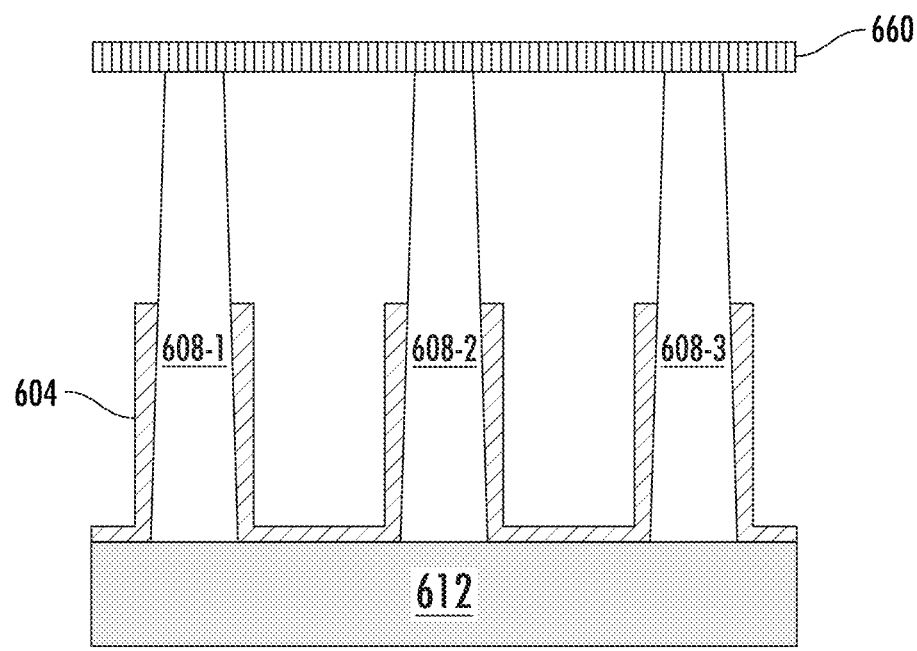
Figure 6C:
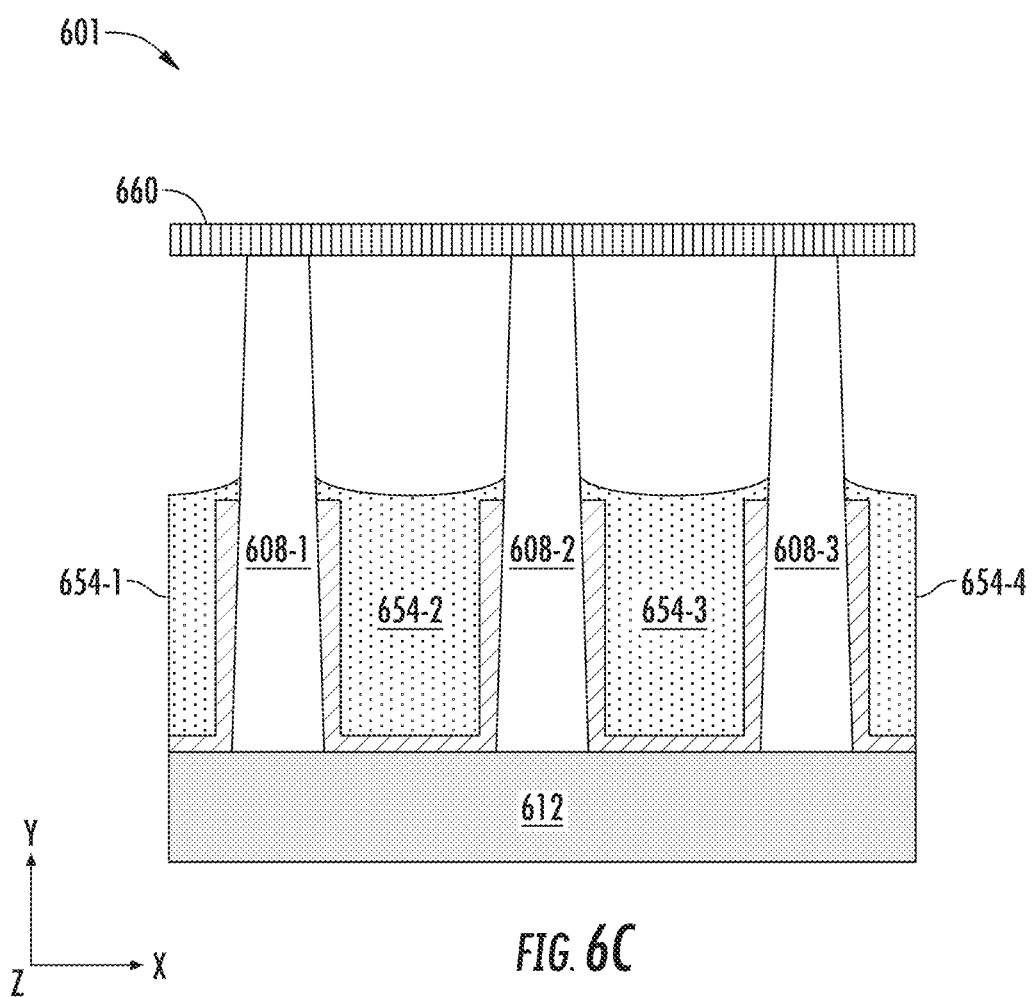

FIGS. 6A-6C illustrate yet another exemplary process flow for producing VFTF components according to one or more embodiments described herein. FIG. 6A includes a base 612 with fins 608-1, 608-2, 608-3 (or fins 608) extending from base 612 along the y-axis, trenches 610 between the fins 608, and a seed layer 604. In some embodiments, base 612 may comprise a semiconductor substrate and fins 608 may comprise a dielectric. FIG. 6B includes a portion of fins 608 covered with seed layer 604 and a portion of fins 608 uncovered from the seed layer 604 via direction etching. Also, FIG. 6B includes a bit line 660 disposed along the top of the fins 608. FIG. 6C shows a VFTF component 601 including a portion of a dynamic random-access memory (DRAM) with buried word lines 654-1, 654-2, 654-3, 654-4 (or word lines 654). In many embodiments, one or more components illustrated in FIGS. 6A-6C, or described with respect thereto, may be the same or similar in construction, function, and/or appearance as one or more other components described herein. Embodiments are not limited in this context.

Figure 7:
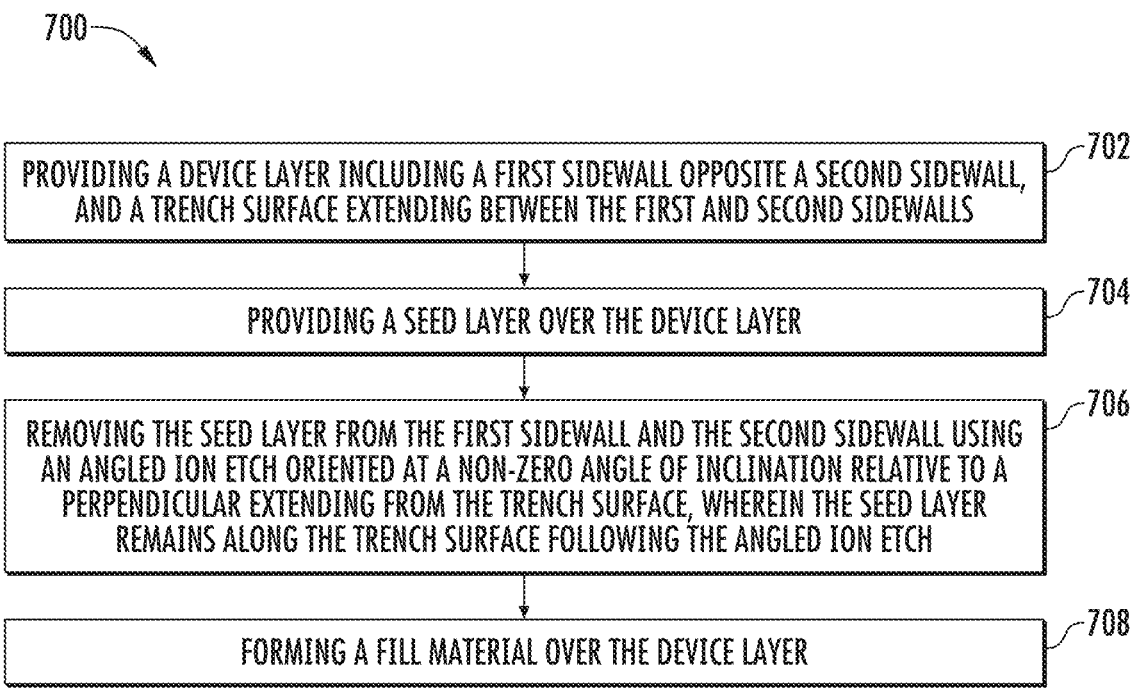
FIG. 7 is a flowchart of a method in producing VFTF components, according to embodiments of the present disclosure.

Turning to FIG. 7, a method 700 according to embodiments of the present disclosure will be described. As shown, at block 702, the method 700 may include providing a device layer including a first sidewall opposite a second sidewall, and a trench surface extending between the first and second sidewalls. In some embodiments, the first and second sidewalls may be opposite sidewalls of a fin of a plurality of fins. In other embodiments, the first and second sidewalls define one or more contacts or via holes.

At block 704, the method 700 may include providing a seed layer over the device layer. In some embodiments, the seed layer may be a metal (e.g., tungsten), an insulator, or a semiconductor.

At block 706, the method 700 may include removing the seed layer from the first sidewall and the second sidewall using an angled ion etch oriented at a non-zero angle of inclination relative to a perpendicular extending from the trench surface, wherein the seed layer remains along the trench surface following the angled ion etch.

At block 708, the method 700 may include forming a fill material over the device layer. In some embodiments, the fill material may be bulk metal deposited via ALD or CVD. Once formed, the fill material may correspond to metal gap-fill in transistors, logic and memory contact fill, vertically integrated memory gate wordline fill, and the like.

For the sake of convenience and clarity, terms such as "top," "bottom," "upper," "lower," "vertical," "horizontal," "lateral," and "longitudinal" will be used herein to describe the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporate the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

In various embodiments, design tools can be provided and configured to create the datasets used to produce the void-free trench-fills described herein. For example, data sets can be created to directionally etch a seed layer from predetermined portion of a trench and/or fin as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

As used herein, a module might be implemented utilizing any form of hardware, software, or a combination thereof. For example, one or more processors, controllers, application-specific integrated circuits (ASICs), programmable logic arrays (PLAs), logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading the description, the various features and functionality described herein may be implemented in any given application. Furthermore, the various features and functionality can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

By utilizing the embodiments described herein, void-free material depositions can be formed. A first technical advantage of the void-free trench-fills (or VFTF components) of the present embodiments includes increasing the available volume of fill materials in a trench. For example, increasing the available volume of metal fill materials in a trench improves conductivity. A second technical advantage of the VFTFs of the present embodiments includes improved manufacturing efficiency by reducing or eliminating time consuming and difficult processes including surface poisoning, lithography, etching, and chemical mechanical polishing. For example, process flows that involve poisoning surfaces (for e.g., ammonia or remote plasma inhibition) to selectively inhibit top-surface growth to avoid pinch-off can be avoided. In another example, CMP processing times can be lowered and slurry-leakage zones can be sealed to eliminate halogen-based device damage. Further, a third technical advantage of the VFTFs of the present embodiments includes contact/plug uniformity, such by avoiding a top V-groove even in wide-pitch trench-fills. A fourth technical advantage of the VFTFs of the present embodiments includes critical dimension dependent directional etching that allows etching to required angles and/or depths as needed in conjunction with selective growth to obtain void-free material depositions.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method, comprising:
providing a substrate comprising a plurality of fins, wherein the plurality of fins each include a first sidewall opposite a second sidewall, and a bottom trench surface extending between the first and second sidewalls;
providing a seed layer over the substrate, including directly over the first sidewall and the second sidewall of the plurality of fins and directly atop the bottom trench surface;
removing the seed layer from the first sidewall and the second sidewall using an angled ion etch oriented at a non-zero angle of inclination relative to a perpendicular extending from the bottom trench surface, wherein ions of the angled ion etch are directed into an entire height of the first and second sidewalls without being directed into the bottom trench surface, and wherein the seed layer remains only along the bottom trench surface following the angled ion etch; and
forming a fill material over the substrate, wherein the fill material is formed to a height below a top surface of the plurality of fins without a removal process performed on the fill material.

2. The method of claim 1, wherein the angled ion etch comprises simultaneously removing the seed layer from the first sidewall and the second sidewall.

3. The method of claim 1, wherein the angled ion etch comprises:
removing the seed layer from the first sidewall;
rotating the substrate; and
removing the seed layer from the second sidewall after the substrate is rotated.

4. The method of claim 1, wherein the fill material is formed by chemical vapor deposition or by atomic layer deposition.

5. The method of claim 1, wherein the fill material is formed along just a lower portion of the first and second sidewalls.

6. The method of claim 1, further comprising:
removing the seed layer from the entire height of the first and second sidewalls; and
forming the fill material after removing the seed layer.

7. A method of forming a memory device, comprising:
providing a substrate comprising a plurality of fins, wherein the plurality of fins each include a first sidewall opposite a second sidewall, and a bottom trench surface extending between the first and second sidewalls;
providing a seed layer over the substrate including directly along the first sidewall and the second sidewall of the plurality of fins, and directly atop the bottom trench surface;
removing the seed layer from the first sidewall and the second sidewall using an angled ion etch oriented at a non-zero angle of inclination relative to a perpendicular extending from the bottom trench surface, wherein ions of the angled ion etch are directed into an entire height of the first and second sidewalls without being directed into the bottom trench surface, and wherein the seed layer remains only along the bottom trench surface following the angled ion etch; and
forming a metal fill material over the substrate, wherein the metal fill material is formed to a height below a top surface of the plurality of fins without a removal process performed on the metal fill material.

8. The method of claim 7, wherein the angled ion etch comprises simultaneously removing the seed layer from the first sidewall and the second sidewall.

9. The method of claim 7, wherein the metal fill material is formed by chemical vapor deposition or by atomic layer deposition.

10. The method of claim 7, wherein the metal fill material is formed along just a lower portion of the first and second sidewalls.

11. The method of claim 7, further comprising:
removing the seed layer from the entire height of the first and second sidewalls; and
forming the metal fill material after removing the seed layer.

12. A method of forming a semiconductor device, comprising:
providing a plurality of device structures extending from a substrate, wherein the plurality of device structures define a plurality of trenches each including a first sidewall opposite a second sidewall, and a bottom trench surface extending between the first and second sidewalls;
providing a seed layer over each of the plurality of device structures including directly along the first and second sidewalls of the plurality of device structures and directly atop the bottom trench surface;
removing the seed layer from the first sidewall and the second sidewall of each of the plurality of device structures using an angled ion etch oriented at a non-zero angle of inclination relative to a perpendicular extending from the bottom trench surface, wherein ions of the angled ion etch are directed into an entire height of the first and second sidewalls without being directed into the bottom trench surface, and wherein the seed layer remains only along the bottom trench surface following the angled ion etch; and
depositing a metal fill material within the plurality of trenches, wherein the fill material is formed within the plurality of trenches to a height below a top surface of the plurality of device structures without a removal process performed on the metal fill material.

13. The method of claim 12, wherein the angled ion etch comprises simultaneously removing the seed layer from the first sidewall and the second sidewall of each of the plurality of trenches.

14. The method of claim 12, wherein the angled ion etch comprises:
- removing the seed layer from the first sidewall of each of the plurality of trenches;
- rotating the plurality of device structures and the substrate; and
- removing the seed layer from the second sidewall of each of the plurality of trenches.

15. The method of claim 12, wherein the metal fill material is formed by chemical vapor deposition or by atomic layer deposition.

16. The method of claim 12, wherein the metal fill material is not formed along an upper portion of the first and second sidewalls of each of the plurality of trenches.

* * * * *